United States Patent
EerNisse et al.

(10) Patent No.: US 9,528,896 B2
(45) Date of Patent: Dec. 27, 2016

(54) QUARTZ RESONATOR PRESSURE TRANSDUCERS AND METHODS OF OPERATION

(71) Applicant: Delaware Capital Formation, Inc., Wilmington, DE (US)

(72) Inventors: Errol P. EerNisse, Salt Lake City, UT (US); Milton Watts, Salt Lake City, UT (US)

(73) Assignee: Quartzdyne, Inc., Salt Lake City, UT (US)

( * ) Notice: Subject to any disclaimer, the term of this patent is extended or adjusted under 35 U.S.C. 154(b) by 921 days.

(21) Appl. No.: 13/839,238

(22) Filed: Mar. 15, 2013

(65) Prior Publication Data
US 2014/0278155 A1   Sep. 18, 2014

(51) Int. Cl.
*H01L 41/113* (2006.01)
*H03H 9/19* (2006.01)
*G01L 11/04* (2006.01)
*E21B 47/06* (2012.01)

(52) U.S. Cl.
CPC ............... *G01L 11/04* (2013.01); *E21B 47/06* (2013.01); *H01L 41/1132* (2013.01); *H03H 9/19* (2013.01)

(58) Field of Classification Search
CPC .............................. H01L 41/1132; H03H 9/19
USPC ........................................................ 310/338
See application file for complete search history.

(56) References Cited

U.S. PATENT DOCUMENTS

| | | | |
|---|---|---|---|
| 3,561,832 A | 2/1971 | Karrer | |
| 3,617,780 A | 11/1971 | Benjaminson | |
| 4,545,638 A | 10/1985 | Neidich | |
| 4,547,691 A | 10/1985 | Valdois et al. | |
| 4,550,610 A | 11/1985 | EerNisse | |
| 4,562,375 A | 12/1985 | Besson et al. | |
| 4,660,420 A | 4/1987 | Eer Nisse | |
| 4,872,765 A | 10/1989 | Schodowski | |
| 5,221,873 A * | 6/1993 | Totty | G01L 9/0022 310/338 |
| 5,394,345 A | 2/1995 | Berard et al. | |
| 6,111,340 A * | 8/2000 | Sinha | G01L 9/0022 310/348 |

(Continued)

OTHER PUBLICATIONS

Besson et al., A Dual-Mode Thickness-Shear Quartz Pressure Sensor, IEEE Transactions on Ultrasonics, Ferroelectrics, and Frequency Control, vol. 40, No. 5, Sep. 1993, pp. 584-591.

(Continued)

*Primary Examiner* — Derek Rosenau
(74) *Attorney, Agent, or Firm* — TraskBritt (57) ABSTRACT

A cylindrical quartz crystal transducer that exhibits a low probability of twinning, and uses a combination of resonator signal inputs at the B-mode and C-mode frequencies to calculate resonator temperature. Crystallographic orientations are disclosed where combinations of B-mode and C-mode resonant frequencies exist that are sufficiently independent of pressure to enable accurate calculation of temperature under transient conditions. Such a transducer is usable at higher pressures and temperatures than conventional quartz pressure transducers. Furthermore, because the structure allows a choice of crystallographic orientation, other characteristics of the transducer, such as increased pressure sensitivity and activity dip-free operation, may be optimized by varying crystallographic orientation.

21 Claims, 8 Drawing Sheets

(56) References Cited

U.S. PATENT DOCUMENTS

| | | | |
|---|---|---|---|
| 6,147,437 | A | 11/2000 | Matsumoto et al. |
| 6,455,985 | B1 | 9/2002 | Matsumoto |
| 2009/0009036 | A1 | 1/2009 | Matsumoto et al. |

OTHER PUBLICATIONS

Eernisse et al., Review of Thickness-Shear Mode Quartz Resonator Sensors for Temperature and Pressure, IEEE Sensors Journal, vol. 1, No. 1, Jun. 2001, pp. 79-87.
Eernisse, E. P., Theoretical Modeling of Quartz Resonator Pressure Trasducers, 41st Annual Frequency Control Symposium, pp. 339-343 (1987).
Kusters, John A., The SC Cut Crystal—An Overview, 1981 Ultrasonics Symposium, pp. 402-409 (1981).
Schodowski, Stanley S., Resonator Self-Temperature-Sensing Using a Dual-Harmonic-Mode Crystal Oscillator, 43rd Annual Symposium on Frequency Control, 1989, pp. 2-7.
Valdois et al., Experimental Verification of Stress Compensation in the SBTC-Cut, IEEE Transactions on Ultrasonics, Ferroelectrics, and Frequency Control, vol. 36, No. 6, Nov. 1989, pp. 643-651.

\* cited by examiner

QUARTZ RESONATOR PRESSURE TRANSDUCERS AND METHODS OF OPERATION

FIELD

The present disclosure relates generally to apparatuses and methods for measurement of high pressures under extreme and transient temperature conditions and, more particularly, to quartz resonator pressure transducers configured to provide integral temperature compensation and methods of using same.

BACKGROUND

Quartz resonator pressure transducers have been used successfully in the downhole environment of oil and gas wells for several decades and are still the most accurate means of determining bottom-hole pressure. While many measurements of these downhole pressures are made under static or slowly varying pressure and temperature conditions, some significant situations, however, require pressure measurements under transient conditions where either or both of the temperature and pressure are changing. The range of static to dynamic measurement conditions, the economic drive for less expensive devices, and the increasing levels of pressures and temperatures arising as the world oil and gas exploration and production industry drills deeper and deeper, have spurred continuing developments in quartz resonator pressure transducers.

Figure 1A:
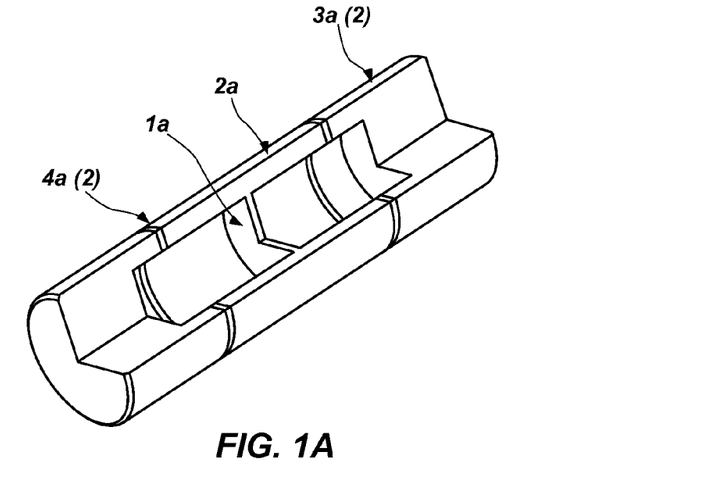
FIG. 1A is a perspective cutaway view of a prior art quartz pressure transducer configuration.

The first commercially successful quartz resonator pressure transducer, as disclosed in U.S. Pat. Nos. 3,561,832 and 3,617,780, the disclosure of each of which is hereby incorporated herein in its entirety by this reference, was introduced by Hewlett Packard ("HP") in the 1970's. This transducer was of a cylindrical design with the resonator formed in a unitary fashion in a single piece of quartz. End caps of quartz were attached to close the structure. FIG. 1A shows this configuration, which contains resonator 1a unitary (integral) with body 2a, two end caps 3a, and two glass joints 4a. This device was relatively large, approximately 1 inch diameter and 4 inches long. The unitary body and resonator are expensive to manufacture. Also, two major disadvantages were caused by the large size. Large stress distributions occur throughout the structure under transient conditions because the temperature distribution is slow to equilibrate. These stresses cause errors in the pressure measurement. Also, it is not practical to obtain a temperature measurement, necessary for temperature compensation, close to the actual location of the pressure measurement, e.g., the resonator, because of the large transducer size. This lack of proximity results in temperature errors in transient conditions because the temperature at a temperature transducer used to temperature compensation may not be the same as the required temperature located at the resonator itself. Both of these problems restricted the use of this concept to the more benign, nearly static cases.

Figure 1B:
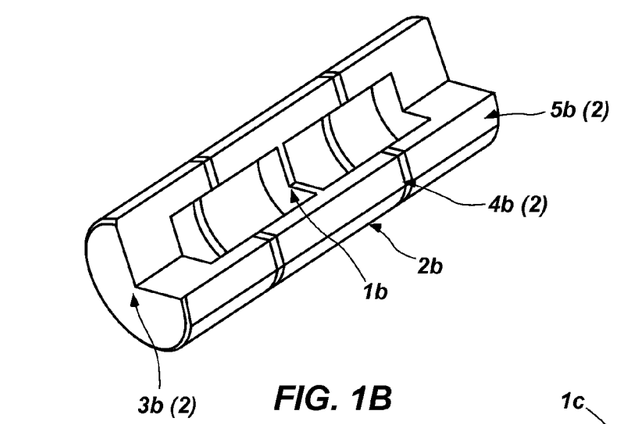
FIG. 1B is a perspective cutaway view of another prior art quartz pressure transducer configuration.

A somewhat smaller size transducer was introduced in the 1980's by Quartztronics, Inc., of Murray, Utah, and commercialized by Halliburton Company through its Halliburton Services operating unit, now part of Halliburton Energy Services. This device, as described in U.S. Pat. Nos. 4,550,610 and 4,660,420, the disclosure of each of which is hereby incorporated herein in its entirety by this reference, was similar to the unitary HP design, except diametrically opposed flats were added to the cylindrical shape to create a non-uniform stress distribution in the resonator under pressure. FIG. 1B shows this structure, which contains resonator 1b unitary with body 2b, two end caps 3b, two glass joints 4b, and a pair of flats 5b (backside flat not shown in FIG. 1B). The smaller size of the Quartztronics transducer reduced the cost, and the flats increased the pressure sensitivity while reducing the temperature sensitivity. The smaller size also reduced the amount of undesired stress distribution from non-uniform thermal distributions and enabled temperature to be measured closer to the pressure measurement location.

Figure 1C:
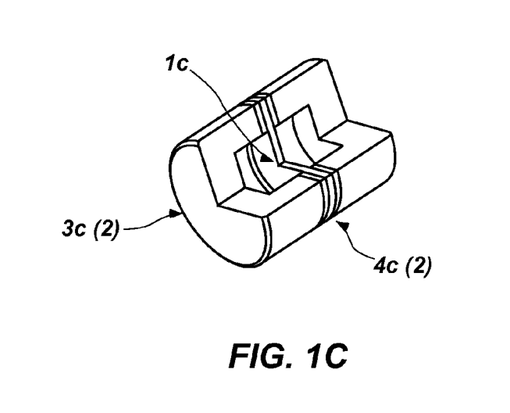
FIG. 1C is a perspective cutaway view of a further prior art quartz pressure transducer configuration.

Another quartz resonator transducer design was introduced in the 1990's by Quartzdyne, Inc. of Murray, Utah. This device eliminated the body/resonator unitary structure by simply bonding a convex-convex resonator between two end caps. FIG. 1C shows this configuration, which contains resonator 1c, two endcaps 3c and two glass joints 4c. Besides low cost, the physical size was small enough to move the temperature measurement point to within a few millimeters of the pressure measurement location.

The foregoing three quartz resonator transducers each use a single resonant mode, the slow-shear thickness mode, or C-mode, to determine pressure external to the transducer. A temperature compensation signal is supplied with an independent temperature measurement device located as close as possible to the pressure measurement (resonator) location.

In light of recognition of a need for good pressure measurements in transient conditions, researchers have explored different ways to use a dual-mode transducer, wherein two resonant modes are driven by the driving circuits of the transducer at the same time. In a dual-mode transducer, one resonant mode is mainly dependent on pressure, the other mode is mainly dependent on temperature. This approach would provide a temperature measurement located exactly where the pressure measurement was made, eliminating one important error source. One mode, usually the C-mode, is used to measure the pressure, and a second mode, the fast-shear mode, or B-mode, is used to determine the temperature. With the two unknowns, pressure and temperature, and two simultaneous measurements, one can solve the two equations. However, during a transient condition, the non-uniform stresses in the structure, arising from non-uniform temperature distributions therein, changes the resonant frequencies. If the B-mode is pressure sensitive, this frequency error will cause an error in the temperature calculation which will, in turn, cause an error in the calculation of the pressure. One is forced to perform a series of iterative calculations that may not lead to accurate pressure and temperature answers. The simplicity and accuracy of the pressure calculation in this case is greatly enhanced if the B-mode is not pressure sensitive. This fact has driven research efforts in dual-mode transducers to find B-modes with no pressure sensitivity while still having a C-mode available for the pressure measurement.

It has been recognized that one way to obtain a B-mode that is independent of pressure is to change the crystallographic orientation of the quartz in the device. This approach led to the SBTC orientation, as described in Michel Valdois, Bikash K. Sinha, and Jean Jacques Boy, EXPERIMENTAL VERIFICATION OF STRESS COMPENSATION IN THE SBTC-CUT, IEEE Trans. Ultrasonics, Ferroelectrics, and Frequency Control, Vol. 36, p. 643, 1989, the disclosure of which is hereby incorporated herein in its entirety by this reference. The shape of the SBTC orientation transducer is identical to that shown in FIG. 1A. Although this concept was successful in obtaining a B-mode with no pressure sensitivity, the C-mode was not usable in a practical oscillator circuit because of high electrical resistance.

Another approach to quartz resonator transducer design is described in U.S. Pat. No. 4,562,375, the disclosure of which is hereby incorporated herein in its entirety by this reference. This structure uses a resonator bonded between two end caps, similar to the structure depicted in FIG. 1C. However, the resonator in this transducer design includes slots to isolate most of the perimeter of the resonator, leaving small bridges to transfer the force from the endcaps along a specific direction such that the B-mode will be pressure insensitive. This structure has never been used commercially. The reason is believed to be that the design cannot withstand the high pressures experienced in a wellbore without failure because of the stress concentrations in the corners of the slots.

Figure 2:
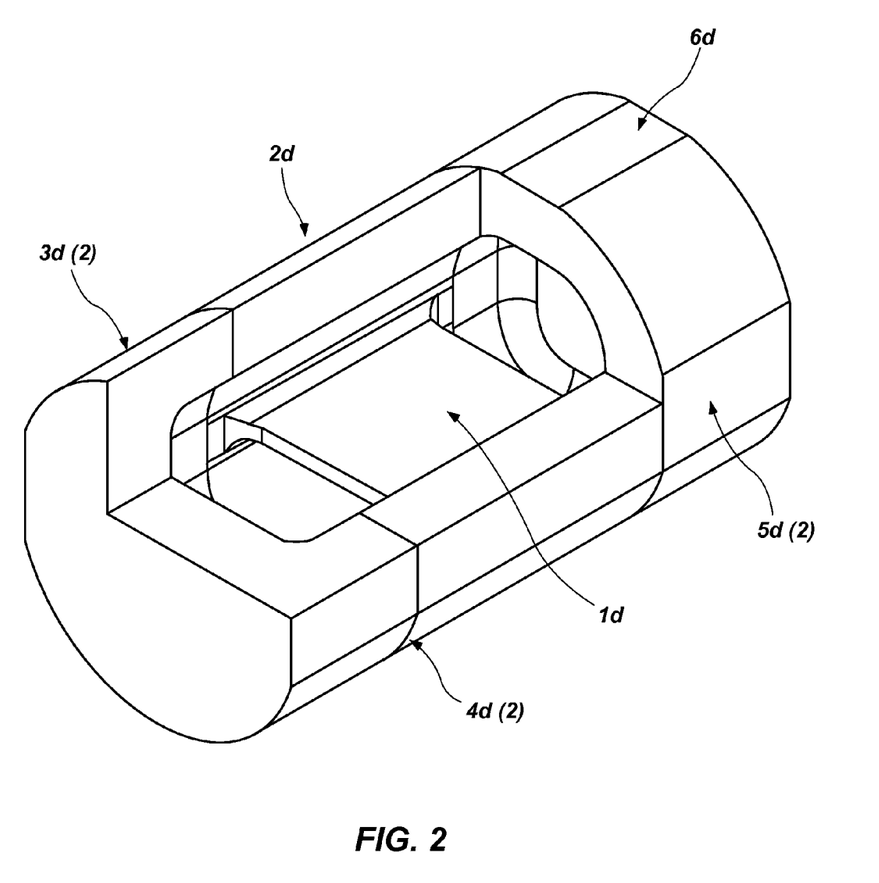
FIG. 2 is a perspective cutaway view of yet another prior art quartz pressure transducer configuration.

To date, the only commercially successful dual-mode quartz pressure transducer is the CQG (Crystal Quartz Gauge), offered by Schlumberger and described in U.S. Pat. Nos. 4,547,691, 5,394,345 and 6,147,437, the disclosure of each of which is hereby incorporated herein in its entirety by this reference. It is a radical departure from the previous structures in that, although the exterior is essentially cylindrical, the resonator is suspended across the inside diameter with the plane of the resonator extending in the axial direction. FIG. 2 shows the CQG structure, which contains resonator $1d$ unitary with body $2d$, two end caps $3d$, and two glass joints $4d$. The drawings of the patents relating to this structure show it with no flats, as well as with flats $5d$. There is an additional small flat $6d$, as shown. This small flat $6d$ is shallow enough that it does not appreciably affect the stress magnitude or distribution in the resonator $1d$, and is apparently used for assembly facilitation to crystallographically orient the end caps $3d$ with the body $2d$. Whereas all previous transducer structures previously mentioned herein exhibit a two-dimensional stress in the resonator, the CQG structure has an almost uniaxial stress pattern in the resonator. The orientation of the resonator can be selected so that the B-mode is pressure insensitive.

There have been several attempts to accomplish dual-mode operation in a structure resembling the Quartztronics design employed by Halliburton, where the stress in the resonator is two-dimensional, but not uniform. One approach is described in U.S. Pat. No. 6,455,985, the disclosure of which is hereby incorporated herein in its entirety by this reference. In this design, the unitary body with the resonator is cylindrical. However, the end caps, while being cylindrical on the outside, are stiffened inside along one direction to create a non-uniform stress in the resonator. A second approach is described in U.S. Pat. No. 6,111,340 (the "'340 patent"), the disclosure of which is hereby incorporated herein in its entirety by this reference. In this design, the structure is the same as the shape employed in the Quartztronics/Halliburton transducer, the only difference being that it is a dual-mode device. However, the '340 patent demonstrates that, even with very deep flats that take up two-thirds (⅔) of the wall thickness, it is not possible to render the B-mode completely independent of pressure but suggests that, if the pressure sensitivity of the B-mode can be reduced sufficiently with the use of the flats, a usable device is possible. This invention would appear to be useful only if the flats are very deep. However, the stress concentrations associated with deep flats may lead to cracking or twinning, and are not consistent with an ongoing desire prevalent throughout the industry to extend the upper limits of pressure and temperature measurement.

As disclosed in Schodowski, RESONATOR SELF-TEMPERATURE-SENSING USING A DUAL-HARMONIC-MODE CRYSTAL OSCILLATOR, 43$^{rd}$ Annual Symposium on Frequency Control, 1989, p. 2 and U.S. Pat. No. 4,872,765 to Schodowski as well as in U.S. Pat. No. 4,545,638 to EerNisse and Ward, the disclosure of each of which is hereby incorporated herein in its entirety by this reference, temperature compensation is accomplished by using two harmonically related resonances, typically the C-mode fundamental and 3$^{rd}$ overtone. The temperature is calculated using the formula $3*f_{Cfund}-f_{C3rd}$. This use of harmonically related vibrational modes must, however, include the fundamental mode to obtain the temperature sensitivity. As the fundamental mode is more spread out than the overtones, a device employing this approach requires a relatively large resonator bore diameter, leaving many unwanted modes not clamped and increasing the chances for an activity dip.

One limitation common to all the quartz resonator pressure transducer concepts is a tendency toward twinning at high applied stress and temperature. Twinning is not reversible and renders the device unusable. In the past few years, the pressures and temperatures encountered in the deeper wells have exceeded the capabilities of the CQG structure, which has stress concentrations in edges and corners. Twinning is less prevalent in designs such as those of FIGS. 1A and 1C with uniform two-dimensional stress in the resonator. Also, because these cylindrical structures minimize the number of corners and edges, cracking and twinning in the rest of the structure is less probable.

BRIEF SUMMARY

Embodiments of the present disclosure employ a substantially cylindrical quartz crystal transducer structure that exhibits a low probability of twinning, and uses a combination of signal inputs at the B-mode and C-mode frequencies to calculate temperature. A range of crystallographic orientations are available where a combination of the B-mode and C-mode frequencies exists that is sufficiently independent of pressure to enable accurate calculation of temperature under transient conditions. Thus, quartz structures, according to the present disclosure, may be used to provide a dual-mode pressure transducer with superior performance in comparison to conventional quartz pressure transducers. In addition, quartz structures of transducers of the present disclosure are less prone to twinning, so such transducers can be used at higher pressures and temperatures than conventional quartz pressure transducers. Furthermore, because the structure of the present disclosure allows a choice of crystallographic orientation, the designer is free to optimize other characteristics, such as increased pressure sensitivity and activity dip-free operation, by varying crystallographic orientation.

In one embodiment, a dual-mode pressure transducer comprises a quartz crystal structure having a crystallographic orientation with phi between about 24° and less than about 30°, wherein the quartz crystal structure comprises a substantially cylindrical body having a longitudinal bore; and a disc-shaped resonator carried by the body and extending transversely across the longitudinal bore.

In another embodiment, a dual-mode pressure transducer comprises a quartz crystal structure comprising a resonator and having a crystallographic orientation adapted to provide a combination of signal inputs from a non-fundamental B-mode resonant frequency and a non-fundamental C-mode resonant frequency of the resonator to enable calculation of temperature of the resonator under transient conditions, wherein the quartz crystal structure comprises a substantially cylindrical body having a longitudinal bore and the resonator is disc-shaped, carried by the body and extends transversely across the longitudinal bore.

In a further embodiment, a method of measuring a temperature-compensated pressure using a quartz crystal structure comprises stimulating, under transient temperature conditions, a resonator under external pressure applied to the quartz crystal structure to provide signal inputs from a non-fundamental B-mode resonant frequency and a non-fundamental C-mode resonant frequency and using a combination of the signal inputs to compensate a pressure determined from the non-fundamental C-mode resonant frequency signal input.

DETAILED DESCRIPTION

To facilitate a more complete understanding of embodiments of the present disclosure and their operation, it is prudent here to develop a basis for evaluating what errors will occur in a dual-mode transducer given a known level of pressure sensitivity of the B-mode, or in the present case, of the sum of $f_C$ and $f_B$. This will be done using some conventional methods for describing the relationship of $f_C$ and $f_B$ with pressure and temperature.

Equations for using two modes for computing pressure, P, and temperature, T, are described, for instance, in R. J. Besson et. al., A DUAL-MODE THICKNESS-SHEAR QUARTZ PRESSURE SENSOR, IEEE Trans. Ultrasonics, ferroelectrics, and Frequency Control, Vol. 40, p. 584, 1993, the disclosure of which is hereby incorporated herein in its entirety by this reference. These equations express the pressure and temperature in two-dimensional power series expansions in the two variables, $f_C$ and $f_B$, which are the measured frequencies of the C-mode and B-mode, respectively. This approach works well because of the smooth behavior of $f_C$ and $f_B$ with pressure and temperature.

Figure 3:
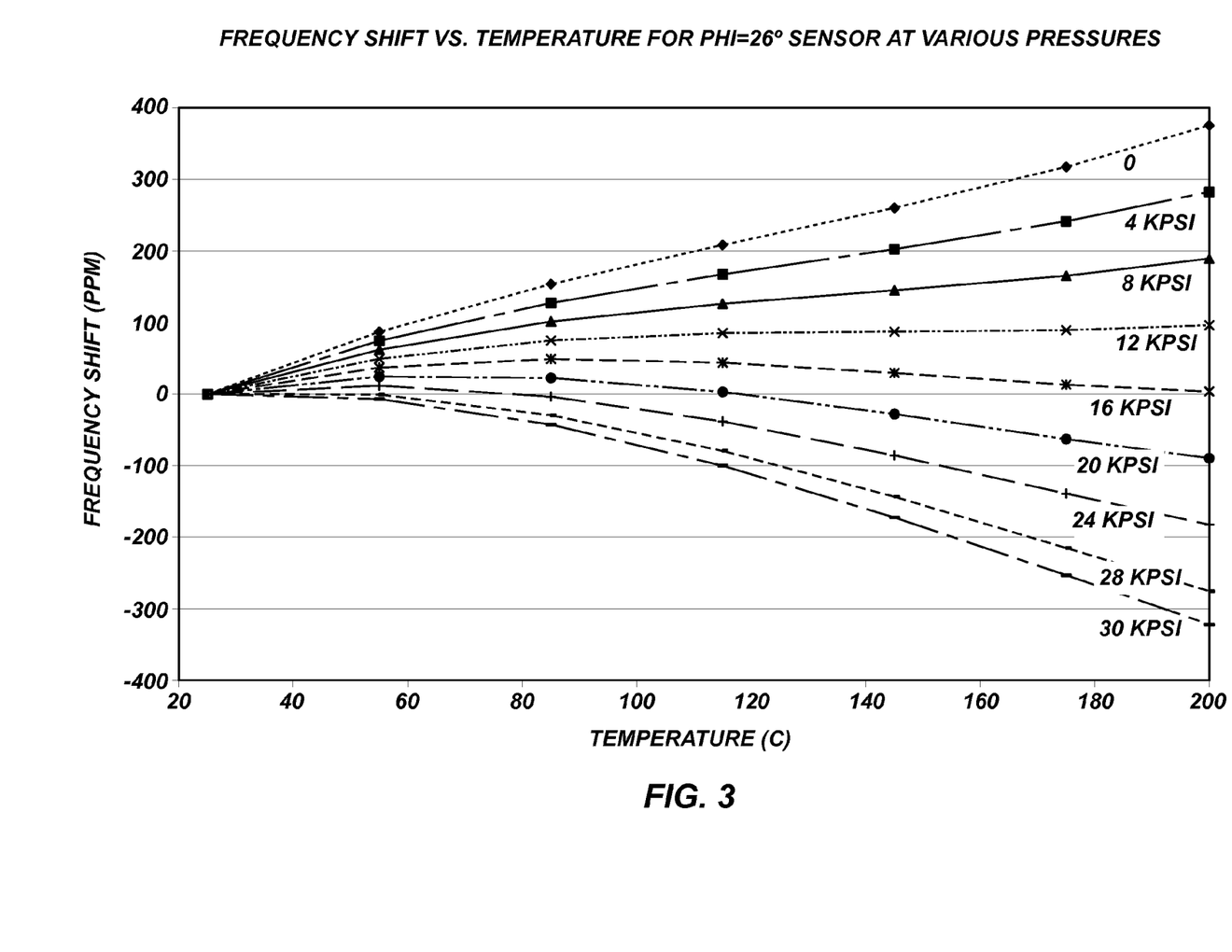
FIG. 3 is a graph of frequency shift versus temperature for phi=26° at various pressures.

FIG. 3 shows the behavior of $f_C$ for a device comprising a transducer structured according to an embodiment of the present disclosure when subjected to a static P and T. The $f_C$ value at atmospheric pressure and a temperature of 25° C. is typically 7.26 MHz. For the behavior illustrated in FIG. 3, the outside diameter of an embodiment of the device configured as shown in FIG. 1C is 0.575 inch, the bore diameter of the end caps is 0.300 inches inch and bore depth is 0.120 inch. The resonator is a $3^{rd}$ overtone blank with a diopter of 2.5 on both sides. The crystallographic orientation is phi=26° and theta is near 34°. As known to those of ordinary skill in the art, the angle phi is the angle between the X-axis and the line of intersection of the blank or atomic plane with the XY-plane of a conventionally employed rectangular coordinate system, while theta is the angle between the Z-axis and the plane of the blank or atomic plane. The appropriate theta angle may be chosen such that the first order temperature coefficient of the C-mode is zero. This may be calculated according to the following equation, known to those of ordinary skill in the art:

$$\Theta = 35.25° - (11/180) \times \Phi$$

The viable pressure range extends to about 30,000 psi and the temperature range is 25° C. to 200° C.

Embodiments of the present disclosure may be physically implemented utilizing the quartz crystal structures illustrated herein in FIGS. 1A and 1C. As noted previously, FIG. 1A depicts a unitary resonator and body with end caps at each end of the body, whereas FIG. 1C depicts a resonator sandwiched between two end caps comprising the body. For example, quartz crystal structures in accordance with the present disclosure may include a convex-convex resonator and two end caps. In other embodiments, the quartz crystal structures in accordance with the present disclosure may include other resonators configurations such as plano-plano and plano-convex.

Referring to FIG. 3, changes in $f_C$ exhibit smooth behavior with shifts in pressure over a wide range of temperatures. The following approach is taken for a theoretical development of the possible errors in using a dual-mode device in a transient situation. At a given static pressure $P_1$ and static temperature $T_1$, the $f_C$ and $f_B$ behavior can be described for small excursions in P and T around $P_1$ and $T_1$ with a Taylor series expansion. The expansion is limited to terms linear in P and T and any cross-products of P and T are ignored.

$$f_C = f_{C1} + \frac{\partial f_C}{\partial T} * (T - T_1) + \frac{\partial f_C}{\partial P} * (P - P_1) \qquad (1)$$

$$f_B = f_{B1} + \frac{\partial f_B}{\partial T} * (T - T_1) + \frac{\partial f_B}{\partial P} * (P - P_1) \qquad (2)$$

If the constants $C_T$, $C_P$, $B_T$, and $B_P$ are defined as follows, $$C_T = \frac{1}{f_{C1}} \frac{\partial f_C}{\partial T} \qquad (3)$$

$$C_P = \frac{1}{f_{C1}} \frac{\partial f_C}{\partial P}$$

$$B_T = \frac{1}{f_{B1}} \frac{\partial f_B}{\partial T}$$

$$B_P = \frac{1}{f_{B1}} \frac{\partial f_B}{\partial P},$$

then equations 1 and 2 can be written as $$f_C = f_{C1} + f_{C1} C_T *(T-T_1) + f_{C1} C_P *(P-P_1) \qquad (4)$$

$$f_B = f_{B1} + f_{B1} B_T *(T-T_1) + f_{B1} B_P *(P-P_1) \qquad (5)$$

Equation 4 can be used in development of an error budget by answering the question: How accurate does one need to know T to calculate P to a given accuracy level? Using Equation 4, we can solve for an error in $f_C$, $\Delta f_C$, caused by an error in T, $\Delta T$, given that P=$P_1$.

$$\Delta f_C = f_{C1} C_T \Delta T. \quad (6)$$

Now, assuming that T=$T_1$, Equation 4 can be solved for P in terms of $f_C$.

$$P - P_1 = \frac{(f_C - f_{C1})}{f_{C1} C_P}. \quad (7)$$

If Equation 6 is substituted into Eq. 7, the error in P, $\Delta P$, can be estimated as $$\Delta P = \frac{C_T}{C_P} \Delta T. \quad (8)$$

As shown by the equation, a combination of a low temperature sensitivity (small $C_T$) and a large pressure sensitivity (large $C_P$) minimizes the P error, $\Delta P$, due to an error in T.

When there is a transient situation involving a temperature shift, there are stresses created in the resonator due to a non-uniform temperature distribution in the resonator. This stress value at the center of the resonator causes a frequency shift that is an error in indicated pressure, which will be termed H. It is conventional to use $f_B$ for the calculation of T. Using Equation 5, the error in T, $\Delta T$, caused by H is $$\Delta T = \frac{B_P}{B_T} H. \quad (9)$$

Thus, an error in the calculated pressure from $\Delta T$ caused by H is represented by $$\Delta P = \frac{C_T}{C_P} \frac{B_P}{B_T} H. \quad (10)$$

This is the error that arises from the pressure sensitivity of $f_B$. It is known in the art to have $B_P$ small and $B_T$ large, as well as small $C_T$ and large $C_P$. The numbers provided in U.S. Pat. No. 6,111,340 may be used to calculate the coefficient in Equation 10 that the inventors therein considered practical, i.e., "substantially insensitive" to pressure, (|$B_P$|≈|$C_P$|, and |$C_T$|≈3 ppm/° C. and |$B_T$|≈28 ppm/° C.). The coefficient is ≈0.107. This indicates that the error in calculating P due to the non-uniform temperature distribution is approximately ten times (10×) less than H, the indicated error in P arising from the non-uniform temperature distribution during a transient event. One may proceed from here assuming that 10× is an approximate threshold for practical dual-mode performance.

Figure 4:
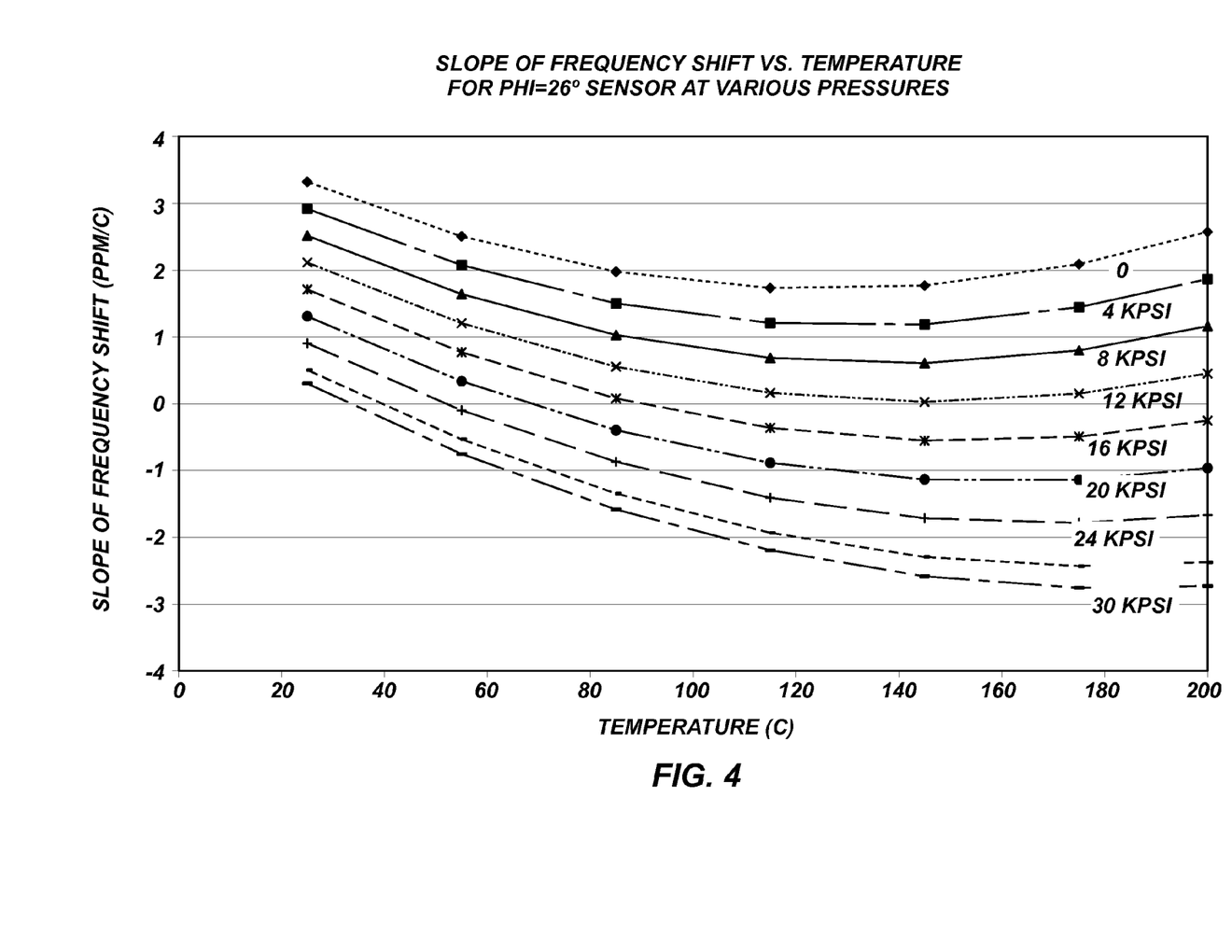
FIG. 4 is a graph of slope of frequency shift versus temperature for phi=26° at various pressures.

FIG. 4 shows the slope of FIG. 3 in ppm/° C. for an embodiment of a quartz pressure transducer according to the present disclosure at phi=26°. The crystallographic orientation has been adjusted to minimize the magnitude of the slope over the entire pressure and temperature ranges to be 3 ppm/° C. This number may be used as one design parameter for evaluating an error budget and this number is approximately the same over the range of phi from 22° to 30°. Also, the $B_T$ coefficient is found to be approximately 28 ppm/° C. over this phi range. One may proceed with these two numbers assumed to be relatively constant over the phi range under consideration herein for implementation of one embodiment of the present disclosure.

One form of the present disclosure uses $f_C + f_B$ for the temperature calculation. An equation may be derived for this case that is equivalent to Equation 10 for the error in P due to H. Assume that P=$P_1$. Then, the change in temperature $\Delta T$ is calculated from Equations 4 and 5 by $$\Delta T = \frac{(f_C + f_B - f_{C1} - f_{B1})}{(f_{C1} C_T + f_{B1} B_T)}. \quad (11)$$

Assume that T=$T_1$. Then if the non-uniform stress is present and there is an error in the indicated pressure of H, the error in frequency for $f_C + f_B$ is given by $$(f_C + f_B - f_{C1} - f_{B1}) = (f_{C1} C_P + f_{B1} B_P) H. \quad (12)$$

When Equations 11 and 12 are combined, the error in T is given by $$\Delta T = \frac{(f_{C1} C_P + f_{B1} B_P)}{(f_{C1} C_T + f_{B1} B_T)} H. \quad (13)$$

Equation 13 for the error in T, combined with Equation 8, provides us with the equivalent of Equation 10:

$$\Delta P = \frac{C_T}{C_P} \frac{(f_{C1} C_P + f_{B1} B_P)}{(f_{C1} C_T + f_{B1} B_T)} H. \quad (14)$$

Equation 14 represents a significant aspect of the disclosure. Instead of $B_P$ and $B_T$ in Equation 10, which are in ppm/psi and ppm/° C., in the present disclosure the coefficients in the parenthesis are calculated using Hz/psi and Hz/° C. The power of this approach becomes evident when looking at FIG. 5. There, the calculated values are shown for $f_{C1}*C_P$ and $f_{B1}*B_P$, as well as the sum ($f_{C1}*C_P + f_{B1}*B_P$) for a round sensor design according to an embodiment of the disclosure over the range of phi angles from 22° to 30°. Since the values are of opposite sign, the sum trends toward zero for phi near 30°.

Figure 6:
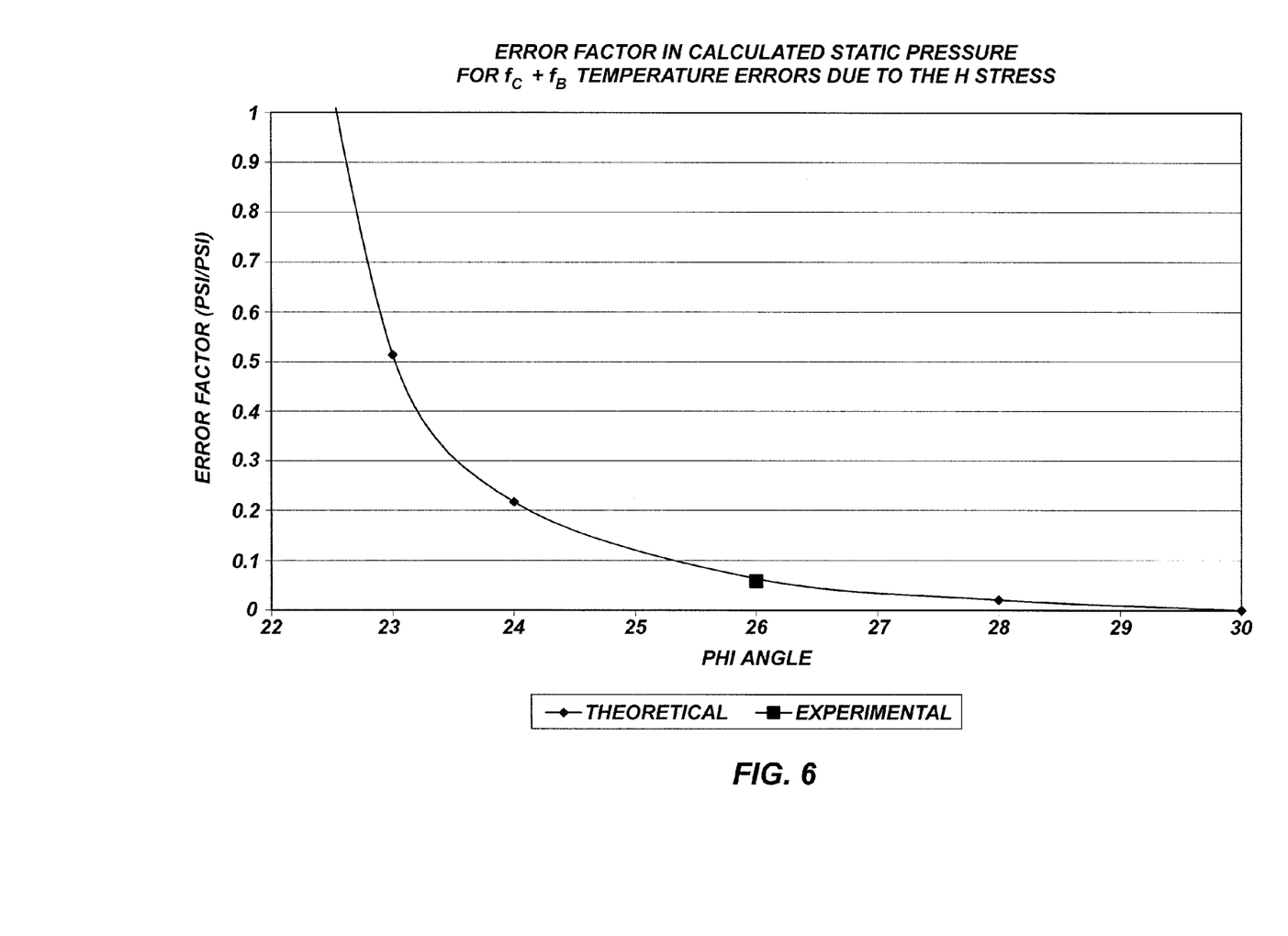
FIG. 6 is a graph of the error factor in calculated static pressure for $f_C+f_B$ temperature errors due to the H stress.

The impact of choice of phi angle is also influenced by the fact that $C_P$ is zero near phi=22° for a round sensor and trends approximately linearly toward −1.5 ppm/psi at phi=30°. Since $C_P$ is in the denominator of Equation 14, the effect of the phi angle on the coefficient in Equation 14 is dramatic. FIG. 6 shows the coefficient in Equation 14 vs. phi angle. It is apparent from FIG. 6 that a round sensor can be used for a dual-mode pressure transducer for phi angles greater than about 25°, where the 10× criteria is approximately satisfied. If one is more aggressive and chooses 5× for the criteria, the lower end of the range of usable phi angles falls to 24°. Although the curve in FIG. 6 is theoretical, the experimental point obtained in this work and shown in FIG. 6 supports the theoretical results.

Figure 5:
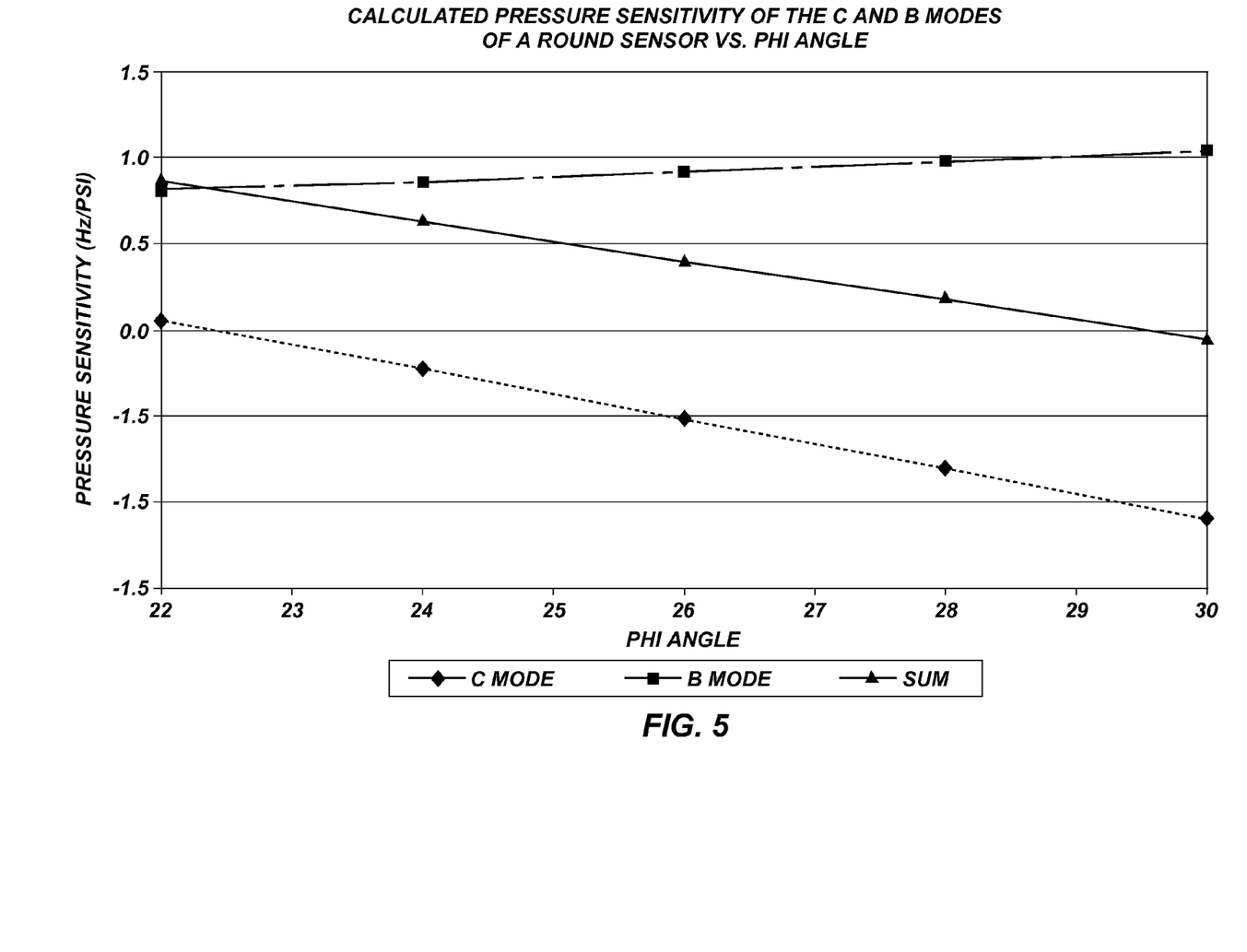
FIG. 5 is a graph of calculated pressure sensitivity of the B- and C-modes of a round quartz pressure transducer versus phi angle.

The use of the sum for $f_C$ and $f_B$ is a result of concentrating attention on the phi angle range in FIG. 5. Since $C_P$ passes through zero around phi of 22°, at lower phi angles one may use the difference $f_B - f_C$ to reduce the error arising in transient conditions. Here, using the difference, the appropriate equation relating the pressure error to H is given by $$\Delta P = \frac{C_T}{C_P} \frac{(f_{B1}B_P - f_{C1}C_P)}{(f_{B1}B_T - f_{C1}C_T)} H. \quad (15)$$

The form of Equation 14 may be maintained by dividing both numerator and denominator of Equation 15 by −1:

$$\Delta P = \frac{C_T}{C_P} \frac{(f_{C1}C_P - f_{B1}B_P)}{(f_{C1}C_T - f_{B1}B_T)} H. \quad (16)$$

The most general form of the present disclosure is based on the fact that once one has the values for $f_C$ and $f_B$, one is free to perform almost any desired calculation. Thus, we may use $f_C + K^*f_B$ to compute T, where K is a scalar number. The equations for this case may be easily derived. Substituting $K^*f_B$ and $K^*f_{B1}$ for $f_B$ and $f_{B1}$, respectively, in Equation 11, the following equation for computing a change in T can be written as $$\Delta T = \frac{(f_C + Kf_B - f_{C1} - Kf_{B1})}{(f_{C1}C_T + Kf_{B1}B_T)}. \quad (17)$$

If the same substitutions are made into Equation 13, the error in T due to the presence of H may be found:

$$\Delta T = \frac{(f_{C1}C_P + Kf_{B1}B_P)}{(f_{C1}C_T + Kf_{B1}B_T)} H. \quad (18)$$

Equation 18 may be used in Equation 8 to arrive at the most general case of the present disclosure:

$$\Delta P = \frac{C_T}{C_P} \frac{(f_{C1}C_P + Kf_{B1}B_P)}{(f_{C1}C_T + Kf_{B1}B_T)} H. \quad (19)$$

Figure 7:
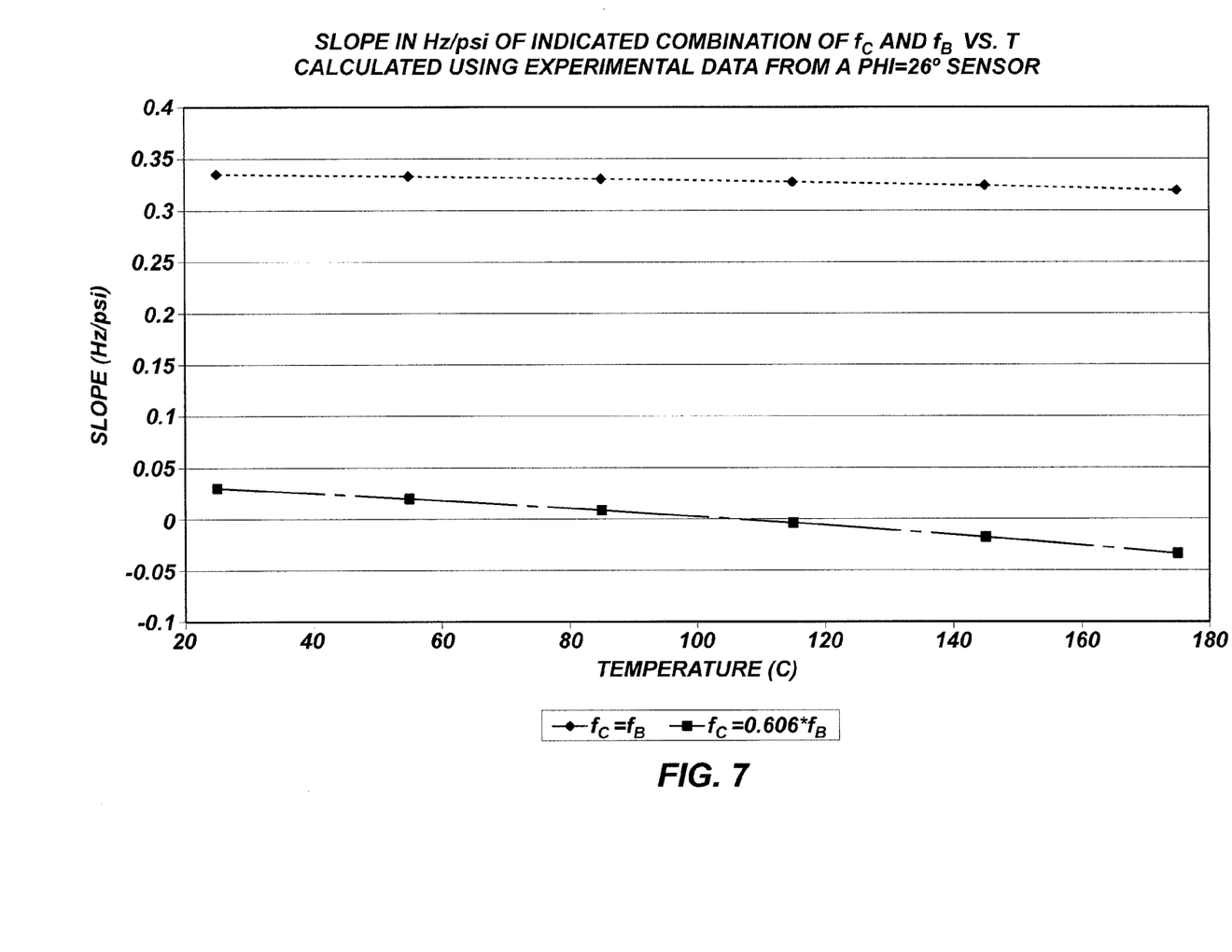
FIG. 7 is a graph of slope in Hz/psi an indicated combination of $f_C$ and $f_B$ versus T, calculated using experimental data from a phi=26° quartz pressure transducer.

Note that Equation 19 becomes Equation 14 when K=1, and becomes Equation 16 when K=−1. However, K may be adjusted to minimize the term $f_{C1}^*C_P + K^*f_{B1}^*B_P$ in Equation 19. This has been done for some calibration data of the sensor used for the experimental point in FIG. 5. The result is shown in FIG. 7, where a K of 0.606 was found to reduce the numerator of Equation 19 over the temperature range employed to practically zero. The fact that there is some small T dependence in FIG. 7 arises because $f_C$ and $f_B$ are not perfectly linear with P and T. Since it has already been shown that the value of 0.33 Hz/psi for $f_C + f_B$ is adequate for actual use, the greatly reduced value in FIG. 7 will provide even superior performance.

Thus, one significant benefit of this disclosure is that by proper choice of the combination $f_C + K^*f_B$, one can now choose the angle phi for the crystallographic orientation of the sensor for other reasons. One option is to choose a phi angle far from 22° to obtain a large pressure sensitivity of $f_C$. Another important consideration is that both the C-mode and B-mode must be free of significant activity dips. Yet another consideration is that the resistance of the two modes changes greatly with phi, so, depending on the circuits to be used in conjunction with the transducer, it may be desirable to adjust phi appropriately.

It should be noted that the use of the deep flats on the transducer body as disclosed in the '340 patent might, if desired, be used to improve the present disclosure in terms of reducing $f_C + f_B$ over that obtained from a round-bodied unit. We can understand this by looking at FIG. 5. With judicious choice of the orientation of the flats, the stresses in the resonator become non-uniform. This can cause the curve for the B-mode to move downward to lower positive values as the P sensitivity decreases, and lower the curve for the C-mode toward larger magnitude, but negative, values for the C-mode as the P sensitivity increases. This reduces the sum $f_C + f_B$ over the value for a round unit. However, the use of flats of any significant depth to create non-uniform stress distributions in the resonator, and in the end caps, may unfortunately increase the potential for twinning, or cracking. In addition, the use of flats may be unnecessary with the present disclosure because the function to be provided by the flats can be effected with $f_C + K^*f_B$.

It should be emphasized that conventional quartz transducer construction practices utilize small exterior flats for alignment purposes during assembly, but such flats are sufficiently small to not cause any appreciable non-uniform stress in the resonator and, accordingly, the term "flat" as applied to quartz transducer structures means and includes a flat or flats of sufficient magnitude to induce non-uniform stress in a resonator of such transducer structures under applied exterior pressure. For example, a transducer body in accordance with at least one embodiment of the present disclosure may include two large flats and two smaller flats, each being offset about 90° about the body of the transducer as shown in FIG. 2. Such a configuration may aid in the assembly of the transducer body by helping to ensure that the end caps and resonator are assembled in the correct orientation. Accordingly, the term "substantially cylindrical" as used herein with regard to quartz transducer structures means and includes structures devoid of a flat or flats of sufficient magnitude to induce non-uniform stress in a resonator of such a quartz transducer structure. For example, a substantially cylindrical transducer body may include one or more flats to aid in the assembly of the transducer body as discussed above.

Figure 8:
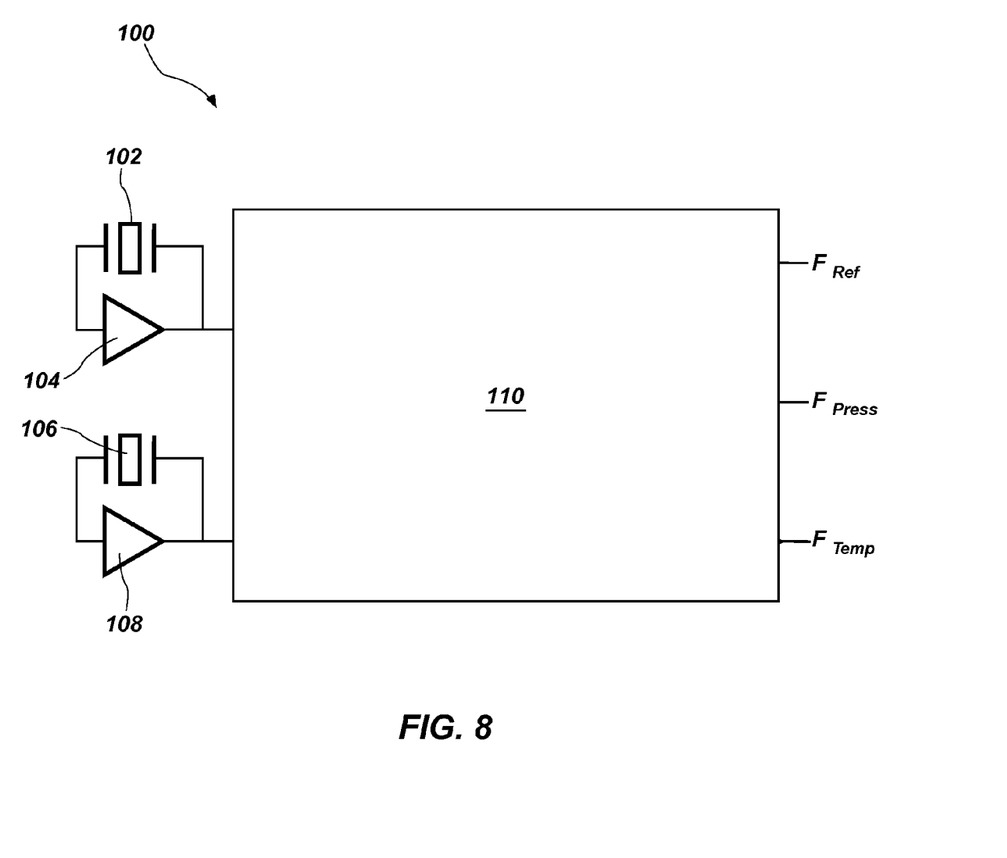
FIG. 8 is a schematic diagram of a circuit suitable for use with embodiments of a quartz crystal pressure transducer according to embodiments of the present disclosure.

FIG. 8 is a schematic diagram of a circuit 100 suitable for use with embodiments of a quartz crystal pressure transducer according to embodiments of the present disclosure. As shown in FIG. 8, the circuit 100 includes a first oscillator 102 driven by a first amplifier 104 for driving a reference crystal (e.g., one of resonators 1a, 1b, 1c (FIGS. 1A through 1C)) at a selected frequency (e.g., about 7.2 MHz). The circuit 100 includes one more oscillators (e.g., oscillator 106 driven by amplifier 108) for driving another crystal (e.g., one of resonators 1a, 1b, 1c) that acts as a dual-mode sensor. For example, the oscillator 106 may drive the dual-mode sensor crystal at two different frequencies (e.g., a C-mode of about 7.24 MHz and a B-mode of about 7.8 MHz) to provide both pressure and temperature measurements from a single crystal. In other embodiments, two oscillators may be utilized to drive the single crystal to provide both pressure and temperature measurements from the single crystal. A frequency signal from the reference crystal may be sent to a processor 110 (e.g., a microcomputer) for further processing, if desired, and that may be outputted to a reference output $F_{REF}$.

One or more frequency signals from the dual-mode sensor crystal (e.g., two frequency signals created by the oscillator 106 driving the crystal at two different frequencies) may be may be sent to the processor 110 for further processing, if desired, and for use in the equations for temperature and pressure as set forth above. The results of those calculations may be outputted to output $F_{TEMP}$ and output $F_{PRESS}$.

In contrast with the state of the art as exemplified by Schodowsky and U.S. Pat. No. 4,545,638 to EerNisse and Ward, embodiments of the present disclosure do not employ the use of harmonically related vibrational modes that require inclusion of the fundamental mode to obtain the required temperature sensitivity and, consequently, avoid the requirement of a relatively large resonator bore diameter and the associate disadvantages indicated above.

For example, in a practical implementation of an embodiment of the present disclosure, any harmonic higher than the fundamental is about the same mode shape and, therefore, usable. Consequently, embodiments of the present disclosure may employ the $3^{rd}$ harmonic of both the B- and C-modes, or a $3^{rd}$ of one of the B-mode and the C-mode and a $5^{th}$ of the other, for temperature calculation and compensation purposes.

While the disclosure may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A dual-mode pressure transducer, comprising:
   a quartz crystal structure having a crystallographic orientation, wherein the quartz crystal structure comprises:
     a double cut comprising:
       a first cut having a first angular displacement (phi) about the X-axis of 26°; and
       a second cut having a second angular displacement (theta) about the Z-axis between 33° and 34°;
     a substantially cylindrical body having a longitudinal bore; and
     a disc-shaped resonator carried by the body and extending transversely across the longitudinal bore; and
   an electronics assembly in communication with the quartz crystal structure, the electronics assembly configured to:
     drive the resonator;
     receive signal inputs from the resonator from a non-fundamental B-mode resonant frequency primarily dependent on temperature;
     receive other signal inputs from the resonator from a non-fundamental C-mode resonant frequency primarily dependent on pressure; and
     calculate pressure-independent temperature under transient conditions using a combination of the signal inputs and the other signal inputs to compensate for the pressure determined from the non-fundamental C-mode resonant frequency.

2. The pressure transducer of claim 1, wherein the disc-shaped resonator is integral with the body, and further including end caps secured to the body across opposing ends of the longitudinal bore.

3. The pressure transducer of claim 1, wherein the body comprises first and second end caps, each end cap defining a portion of the longitudinal bore on opposing sides of the disc-shaped resonator and having the disc-shaped resonator secured therebetween.

4. The pressure transducer of claim 1, wherein the resonator is a $3^{rd}$ overtone blank with a contour of 2.5 diopters on both sides.

5. A method of measuring a temperature-compensated pressure using a quartz crystal structure, the method comprising:
   stimulating, under transient temperature conditions, the disc-shaped resonator of the quartz crystal structure of the dual-mode pressure transducer of claim 1 under external pressure applied to the quartz crystal structure to provide signal inputs from a non-fundamental B-mode resonant frequency and a non-fundamental C-mode resonant frequency; and
   using a combination of the signal inputs to compensate a pressure determined from the non-fundamental C-mode resonant frequency signal input.

6. The method of claim 5, wherein using a combination of the signal inputs comprises using a sum of the signal inputs.

7. The method of claim 5, wherein the non-fundamental B-mode resonant frequency and the non-fundamental C-mode resonant frequency is the $3^{rd}$ harmonic of each mode.

8. The method of claim 5, further comprising determining a change in temperature with the following equation:

$$\Delta T = \frac{(f_C + Kf_B - f_{C1} - Kf_{B1})}{(f_{C1} C_T + Kf_{B1} B_T)}.$$

9. The method of claim 5, further comprising determining a change in pressure with the following equation:

$$\Delta P = \frac{C_T}{C_P} \frac{(f_{C1} C_P + Kf_{B1} B_P)}{(f_{C1} C_T + Kf_{B1} B_T)} H.$$

10. The method of claim 9, selecting a value of the constant K in the equation defining the change in pressure to minimize temperature dependence of the equation defining the change in pressure.

11. A dual-mode pressure transducer, comprising:
    a quartz crystal structure comprising:
      a resonator and having a crystallographic orientation; and
      a substantially cylindrical body having a longitudinal bore, wherein the resonator is disc shaped, carried by the body and extends transversely across the longitudinal bore; and
    an electronics assembly comprising at least one oscillator and at least one amplifier configured to drive the resonator, wherein the electronics assembly is in communication with the quartz crystal structure and is configured to provide signal inputs from the resonator comprising a non-fundamental B-mode resonant frequency primarily dependent on temperature and a non-fundamental C-mode resonant frequency of the resonator primarily dependent on pressure to enable calculation of temperature under transient conditions from a combination of the signal inputs.

12. The pressure transducer of claim 11, wherein the disc-shaped resonator is integral with the body, and further including end caps secured to the body across opposing ends of the longitudinal bore.

13. The pressure transducer of claim 11, wherein the body comprises first and second end caps, each end cap defining a portion of the longitudinal bore on opposing sides of the disc-shaped resonator and having the disc-shaped resonator secured therebetween.

14. The pressure transducer of claim 11, wherein the non-fundamental resonant frequency of the B-mode and the non-fundamental resonant frequency of the C-mode is the $3^{rd}$ harmonic of each mode.

15. The pressure transducer of claim 11, wherein the quartz crystal structure exhibits a crystallographic orientation with a first angular displacement (phi) about the X-axis between about 24° and less than about 30°.

16. The pressure transducer of claim 15, wherein the first angular displacement (phi) about the X-axis is 26°.

17. The pressure transducer of claim 11, wherein the crystallographic orientation comprises a second angular displacement (theta) about the Z-axis between about 33° and 34°.

18. The pressure transducer of claim 11, wherein the quartz crystal structure enables the calculation of temperature of the resonator under transient conditions by employing $f_C + f_B$ from the combination of the signal inputs for a first angular displacement (phi) about the X-axis angle of between 22° and 30°.

19. The pressure transducer of claim 11, wherein the electronics assembly is further configured to calculate pressure-independent temperature under transient conditions using a combination of the signal inputs to compensate for the pressure determined from the non-fundamental C-mode resonant frequency.

20. The pressure transducer of claim 11, wherein the electronics assembly is configured to calculate change in temperature and change in pressure with the following equations:

$$\Delta T = \frac{(f_C + Kf_B - f_{C1} - Kf_{B1})}{(f_{C1}C_T + Kf_{B1}B_T)} \text{ and } \Delta P = \frac{C_T}{C_P} \frac{(f_{C1}C_P + Kf_{B1}B_P)}{(f_{C1}C_T + Kf_{B1}B_T)} H.$$

21. A dual-mode pressure transducer, comprising:

a quartz crystal structure having a crystallographic orientation with a first angular displacement (phi) about the X-axis greater than 24° and less than 30°, wherein the quartz crystal structure comprises:

a substantially cylindrical body having a longitudinal bore; and a disc-shaped resonator carried by the body and extending transversely across the longitudinal bore; and an electronics assembly in communication with the quartz crystal structure, the electronics assembly configured to:

drive the resonator; and receive signal inputs from the resonator from a non-fundamental B-mode resonant frequency primarily dependent on temperature and from a non-fundamental C-mode resonant frequency primarily dependent on pressure to enable calculation of pressure-independent temperature of the resonator under transient conditions using the signal inputs.

* * * * *

UNITED STATES PATENT AND TRADEMARK OFFICE
CERTIFICATE OF CORRECTION

PATENT NO. : 9,528,896 B2
APPLICATION NO. : 13/839238
DATED : December 27, 2016
INVENTOR(S) : Errol P. EerNisse and Milton Watts Page 1 of 1

It is certified that error appears in the above-identified patent and that said Letters Patent is hereby corrected as shown below:

In the Specification
Column 6, Line 2, change "0.300 inches inch" to --0.300 inch--

Signed and Sealed this
Twentieth Day of February, 2018

Andrei Iancu
*Director of the United States Patent and Trademark Office*